(12) United States Patent
Ray et al.

(10) Patent No.: US 6,597,584 B1
(45) Date of Patent: Jul. 22, 2003

(54) EJECTOR ASSEMBLY

(75) Inventors: Brian Ray, San Jose, CA (US); Alice Meng, Redwood City, CA (US); Dan Harden, Palo Alto, CA (US); Robert Riccomini, Saratoga, CA (US); Paul Briel, Campbell, CA (US); Richard Schuler, San Francisco, CA (US); Jay Pochop, San Jose, CA (US); Andy Moorwood, Sunnyvale, CA (US)

(73) Assignee: Extreme Networks, Inc., Santa Clara, CA (US)

( * ) Notice: Subject to any disclaimer, the term of this patent is extended or adjusted under 35 U.S.C. 154(b) by 0 days.

(21) Appl. No.: 09/752,500

(22) Filed: Dec. 27, 2000

(51) Int. Cl.[7] .............................. H05K 7/14; H05K 7/18
(52) U.S. Cl. ..................... 361/798; 361/826; 361/825; 361/755; 361/725; 361/752
(58) Field of Search ................................ 361/798, 759, 361/802, 725, 755, 754, 752, 747, 740, 730, 726, 827, 801, 826, 825

(56) References Cited

U.S. PATENT DOCUMENTS

| | | | | |
|---|---|---|---|---|
| 5,708,742 A | * | 1/1998 | Beun et al. | 385/134 |
| 6,095,851 A | * | 8/2000 | Laity et al. | 439/490 |
| 6,285,548 B1 | * | 9/2001 | Hamlet et al. | 174/15.1 |
| 6,407,933 B1 | * | 6/2002 | Bolognia et al. | 174/168 |

* cited by examiner

Primary Examiner—David Martin
Assistant Examiner—Hung Bui
(74) Attorney, Agent, or Firm—Blakely Sokoloff Taylor & Zafman, LLP

(57) ABSTRACT

An ejector assembly is provided. The ejector assembly is detachably coupled to a circuit board to allow the circuit board to be locked in a chassis and separated from the chassis. The ejector assembly comprises a base portion and a locking portion. The base portion is rotatably coupled to the circuit board via a connector. The locking portion is capable of locking the circuit board into place when the ejector assembly is moved from a first position to a second position while the circuit board is in the chassis. In an alternative embodiment, the ejector assembly further comprises a holder to hold a number of cables.

40 Claims, 7 Drawing Sheets

EJECTOR ASSEMBLY

FIELD OF THE INVENTION

The present invention relates to the field of circuit boards, and more particularly, to an ejector assembly.

BACKGROUND

Presently, circuit boards or blades that are made to be inserted into a chassis are difficult to insert and remove from the chassis. Current assemblies that allow the blades to lock into place within the chassis are not designed to allow a user easy handling of the blade. Many times, an ejector mechanism does not have any lever or handle that allows the user to grasp it and pull the blade out of the chassis. Thus, it is desirable to have an ejector assembly that allows for easy manipulation of the blade as well as locking the blade into place in the chassis.

In addition, each blade in a chassis generally has a number of cables connected to the front end of the blade. These cables tend to be cumbersome and unmanageable as the number of cables connected to the blades increase. Products exist that attempt to combat this problem. For example, there are products such as raceways that run vertically adjacent to the chassis and route the cables away from the blades and the chassis. In addition, raceways coupled adjacent to the blades and above the chassis also route the cables away from the blades. These raceways may serve to combat the problem of cumbersome cables hanging in front of the blades. However, it creates new problems when an individual blade must be removed from the chassis. In this case, it is difficult to discern which cables routed to the raceways are connected to which blades in the chassis. Then, the task of removing an individual blade is made very difficult. Thus, it is desirable to have an ejector assembly for each blade that holds the cables connected to that blade and allows for easy insertion and separation of the blade.

SUMMARY OF THE INVENTION

Accordingly, an ejector assembly is provided. The ejector assembly is detachably coupled to a circuit board to allow the circuit board to be locked into place in a chassis and separated from the chassis. The ejector assembly comprises a base portion and a locking portion. The base portion is rotatably coupled to the circuit board via a connector. The locking portion is capable of locking the circuit board into place when the ejector assembly is moved from a first position to a second position while the circuit board is in the chassis. In an alternative embodiment, the ejector assembly further comprises a holder to hold a number of cables.

BRIEF DESCRIPTION OF THE DRAWINGS

The present invention is illustrated by way of example, and not imitation, in the figures of the accompanying drawings in which.

DETAILED DESCRIPTION

An ejector assembly is disclosed. In the following detailed description of the present invention, numerous specific details are set forth in order to provide a thorough understanding of the present invention. However, it will be apparent to one skilled in the art that the present invention may be practiced without these specific details. In some instances, well-known structures and devices are shown in block diagram form, rather than in detail, in order to avoid obscuring the present invention.

Figure 1:
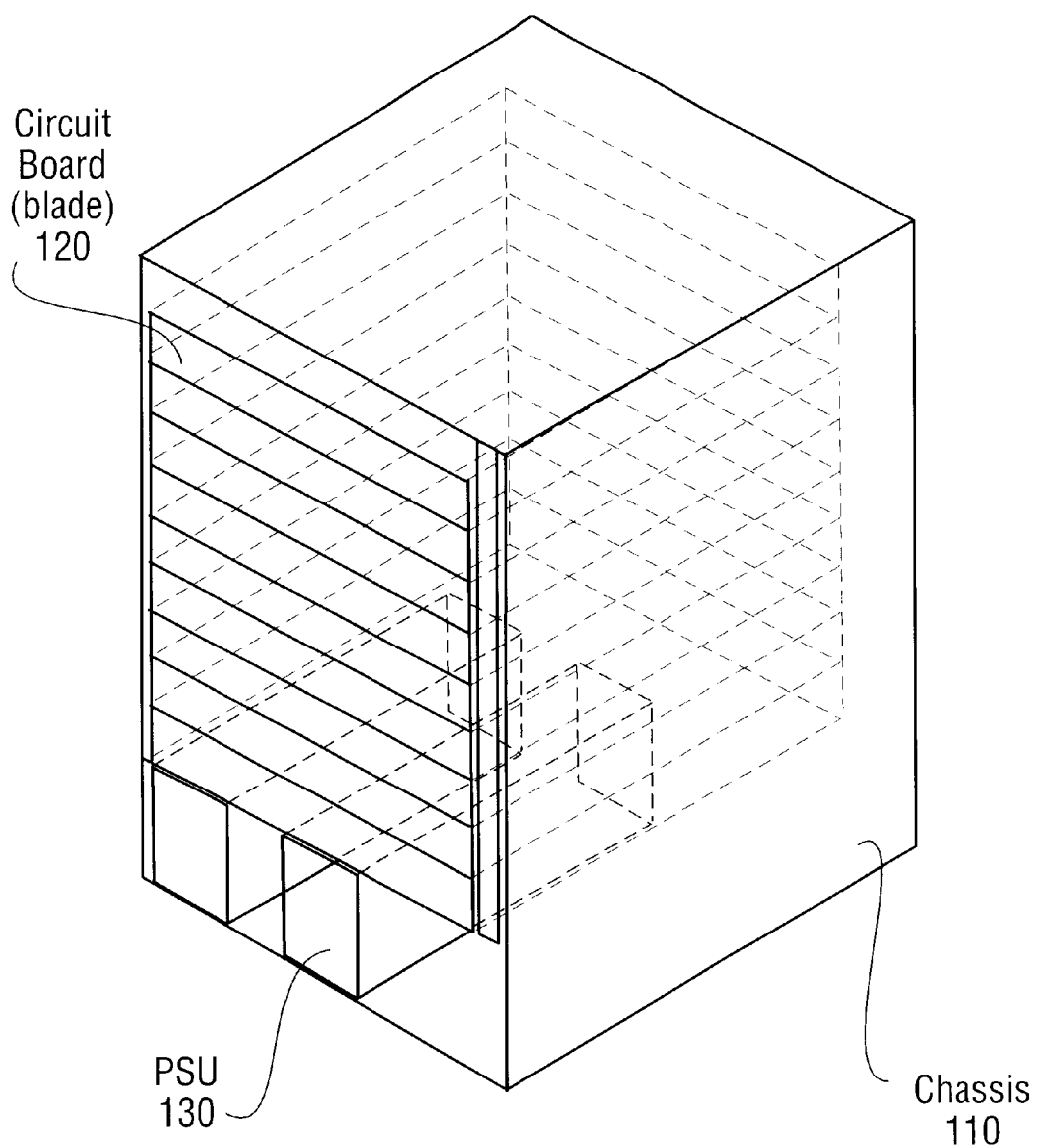
FIG. 1 illustrates a three dimensional view of circuit boards in a chassis.
Figure 2:
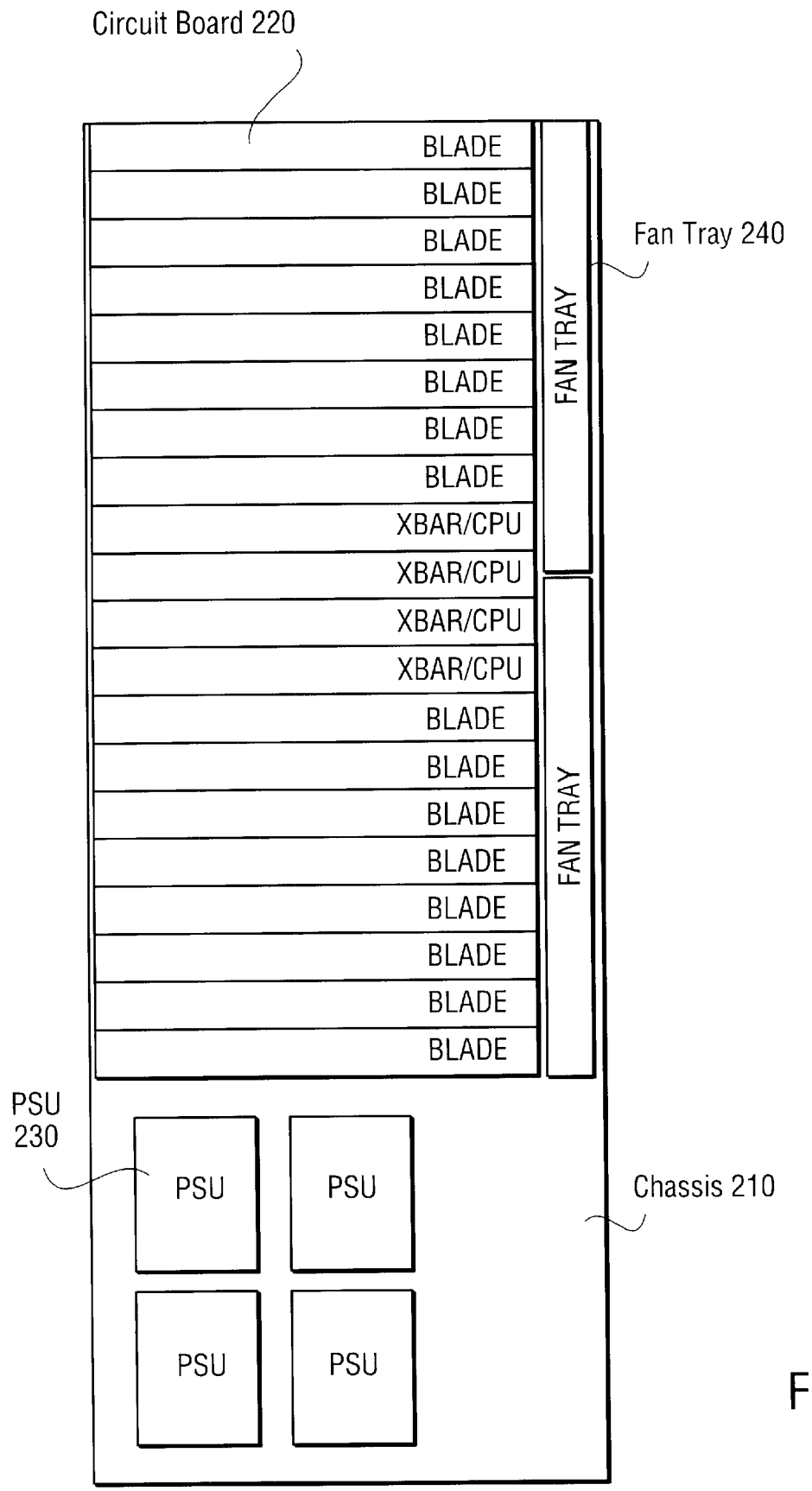
FIG. 2 illustrates a front view of circuit boards in a chassis.

FIG. 1 illustrates a three-dimensional view of circuit boards 120 in a chassis 110. Each circuit board 120 is in the form of a blade that is inserted into the chassis 110. A chassis can hold several blades. Also shown in FIG. 1 are the power supply units (PSUs) 130 in the chassis. FIG. 2 illustrates a front view of the circuit boards 220 in the chassis 210. These circuit boards 220 are blades inserted into the chassis. In this figure, fan trays 240 and PSUs 230 are also shown.

Figure 3:
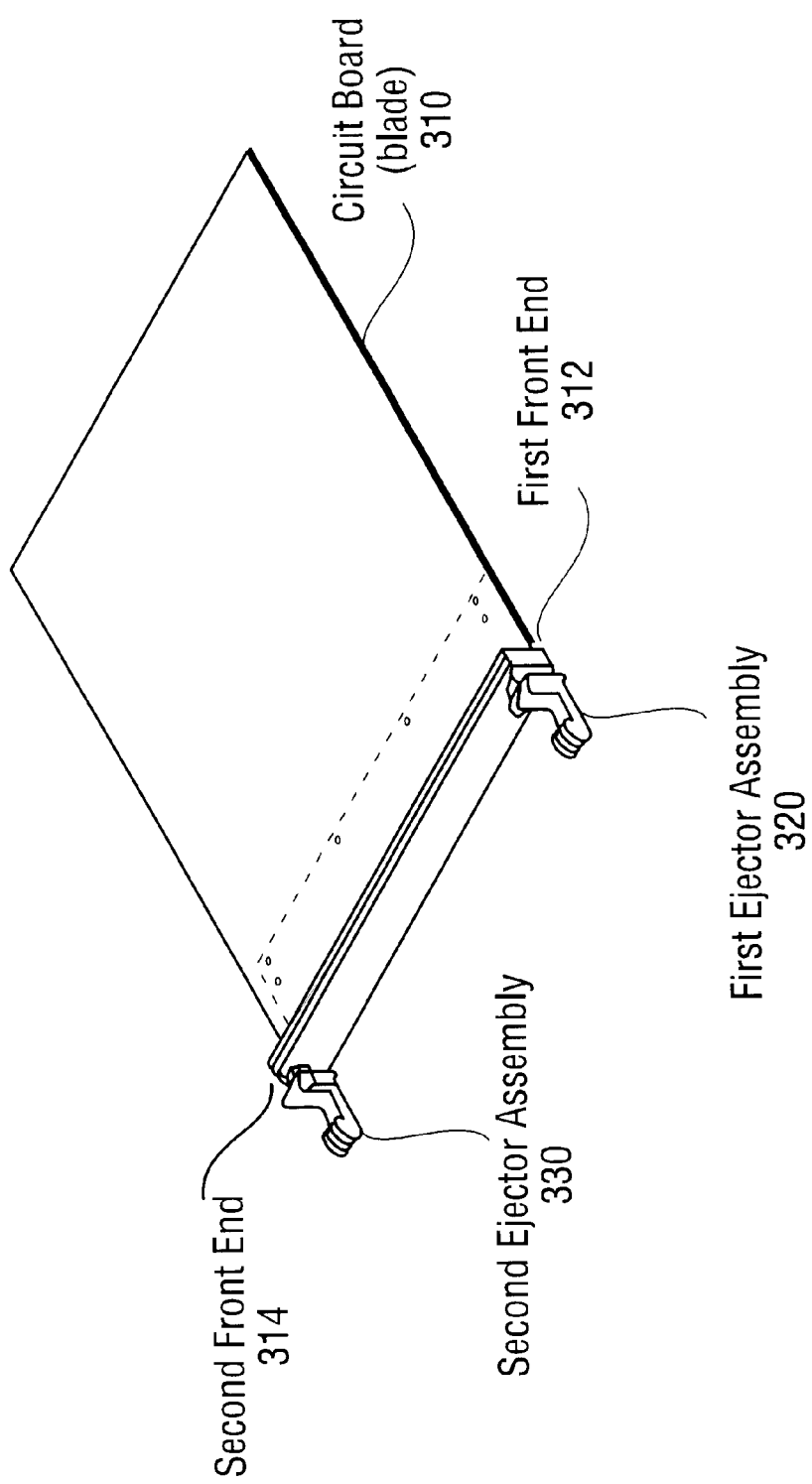
FIG. 3 illustrates a three dimensional view of one embodiment of two ejector assemblies coupled to a circuit board.

FIG. 3 illustrates a three dimensional view of one embodiment of two ejector assemblies coupled to a circuit board 310. The first ejector assembly 320 is coupled to a first front end 312 of the circuit board 310. The second ejector assembly 330 is coupled to a second front end 314 of the circuit board 310. In this embodiment, there are two ejector assemblies. Coupling two ejector assemblies to the circuit board facilitates in the insertion and removal of the circuit board from the chassis. In alternative embodiments, there may be only one ejector assembly coupled to the circuit board.

In the embodiment shown in FIG. 3, the ejector assemblies 320 and 330 are coupled to the circuit board 310 using a hinge assembly. A hinge assembly, as a connector, allows the ejector assemblies 320 and 330 to rotate relative to the circuit board 310. After the circuit board 310 is inserted into the chassis, the ejector assemblies 320 and 330 are rotated so that the circuit board 310 is locked into place in the chassis. When the circuit board 310 is removed from the chassis, the ejector assemblies 320 and 330 are rotated again until the circuit board 310 is not locked in place and may be removed from the chassis. In alternative embodiments, the connector that couples the ejector assembly to the circuit board may be another mechanism or piece. In one alternative embodiment, the connector may be a screw that connects an extended base portion of the ejector assembly to a base of the circuit board such that the ejector assembly is able to rotate relative to the circuit board.

Figure 4:
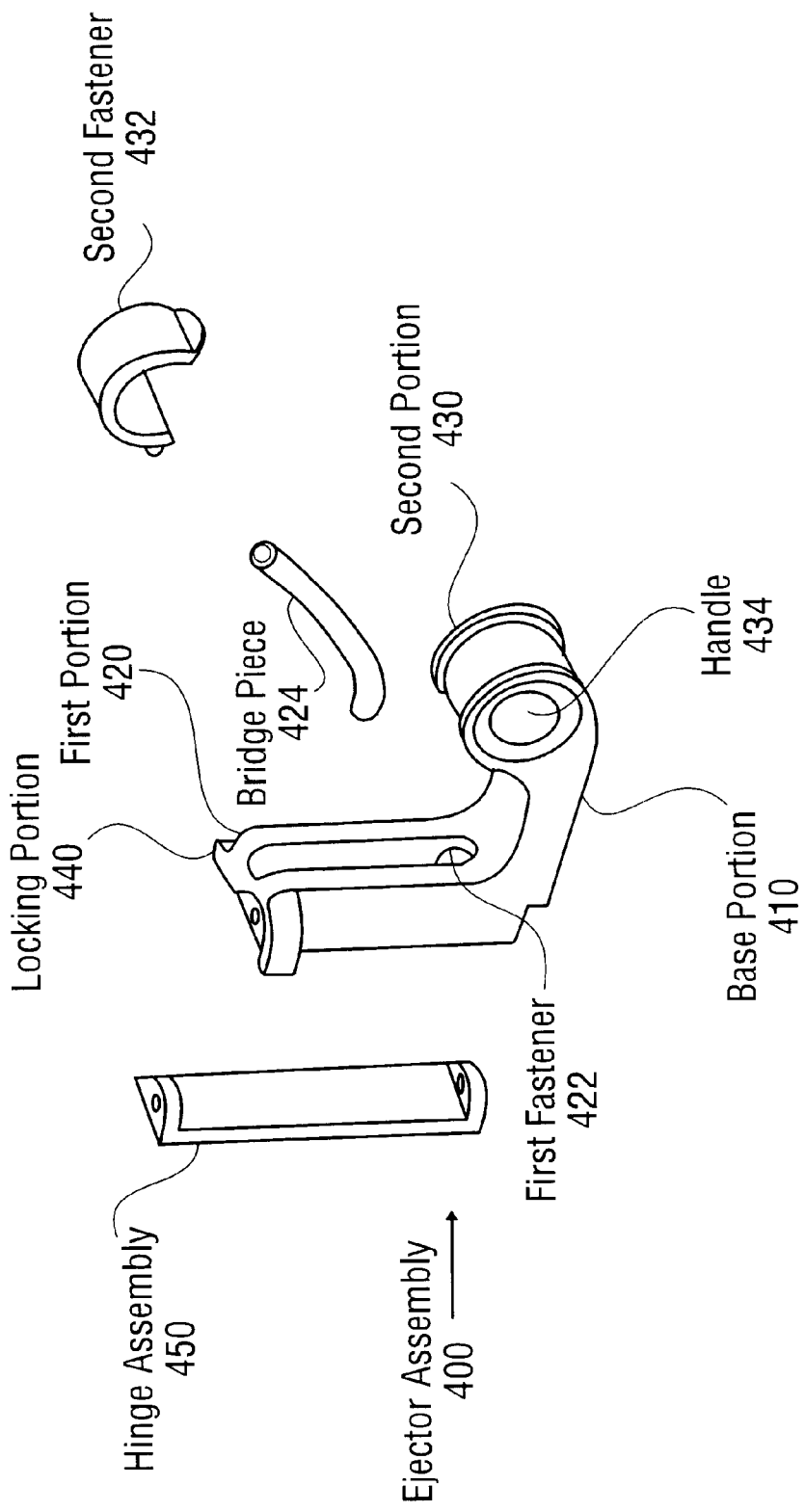
FIG. 4 illustrates an exploded view of an embodiment of an ejector assembly.

FIG. 4 illustrates an exploded view of an embodiment of an ejector assembly 400. The ejector assembly 400 includes a base portion 410, a first portion 420, and a second portion 430. The first portion 420 and the second portion 430 are attached to the base portion 410. In this embodiment, the connector that couples the ejector assembly 400 to a circuit board is a hinge assembly 450. The hinge assembly 450 is detachably coupled to the first portion 420. The hinge assembly 450 allows the ejector assembly 400 to rotate relative to a circuit board. In the embodiment shown in FIG. 4, the first portion 420 includes an aperture in which a first fastener 422 is located. The first fastener 422 detachably couples a bridge piece 424 to the first portion 420 of the ejector assembly 400.

In FIG. 4, the second portion includes a handle 434 to allow a user to pull the circuit board from the chassis. In alternative embodiments, this handle may not be included. A second fastener 432 is attached to the bridge piece 424 to allow the bridge piece 424 to be detachably coupled to the second portion 430 of the ejector assembly 400.

In one embodiment, the bridge piece may be an elastomeric band. In an alternative embodiment, the bridge piece may be a rigid piece made of plastic. In another alternative embodiment, the bridge piece may be a flexible piece such as surgical tubing.

In one embodiment, the ejector assembly may be made of machined plastic. In an alternative embodiment, the ejector assembly may be made of machined metal. In another alternative embodiment, the ejector assembly may be made of plastic or metal die cast. The ejector assembly may also be made of ejection molded thermal plastic.

Figure 5:
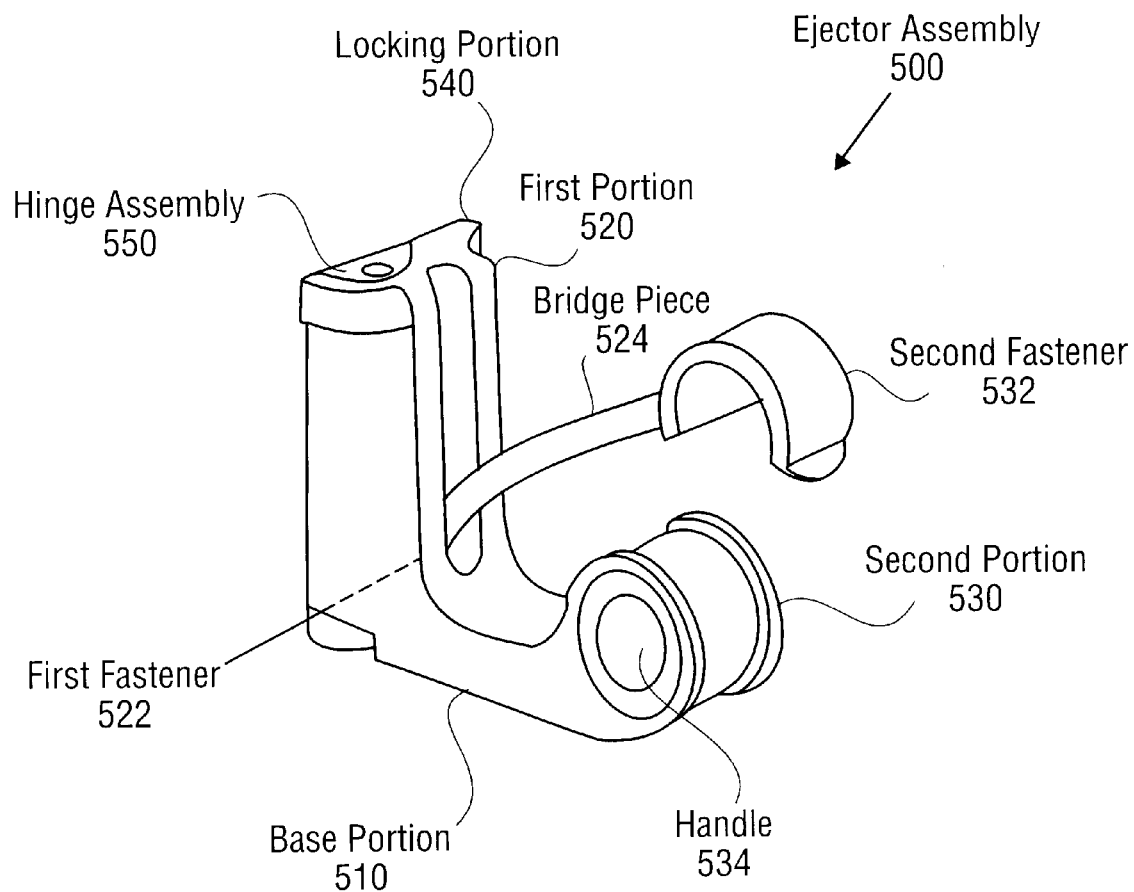
FIG. 5 illustrates a three dimensional view of an embodiment of an ejector assembly.

FIG. 5 illustrates a three dimensional view of an embodiment of an ejector assembly 500. The ejector assembly 500 is similar to the ejector assembly 400 shown in FIG. 4. However, in this figure, the elements of the ejector assembly 500 are shown as assembled. The ejector assembly 500 includes a base portion 510 and a first portion 520 and second portion 530 attached to the base portion 510. A connector such as a hinge assembly 550 rotatably couples the ejector assembly 500 to a circuit board.

A locking portion 540 allows the ejector assembly 500 to lock the circuit board in place within a chassis. In FIG. 5, the locking portion 540 is a protruding portion that catches a wall of the chassis as the ejector assembly 500 is rotated. In this embodiment, the locking portion has a smaller length than the base portion.

In FIG. 5, the ejector assembly 500 also includes a bridge piece 524 coupled to a first fastener on one end and a second fastener 532 on the other end. The first fastener 522 is coupled to the first portion 520, and the second fastener 532 is coupled to the second portion 530. In the embodiment shown in FIG. 5, the second fastener 532 is a pivot clip that detachably couples to a handle 534 on the second portion.

Figure 6:
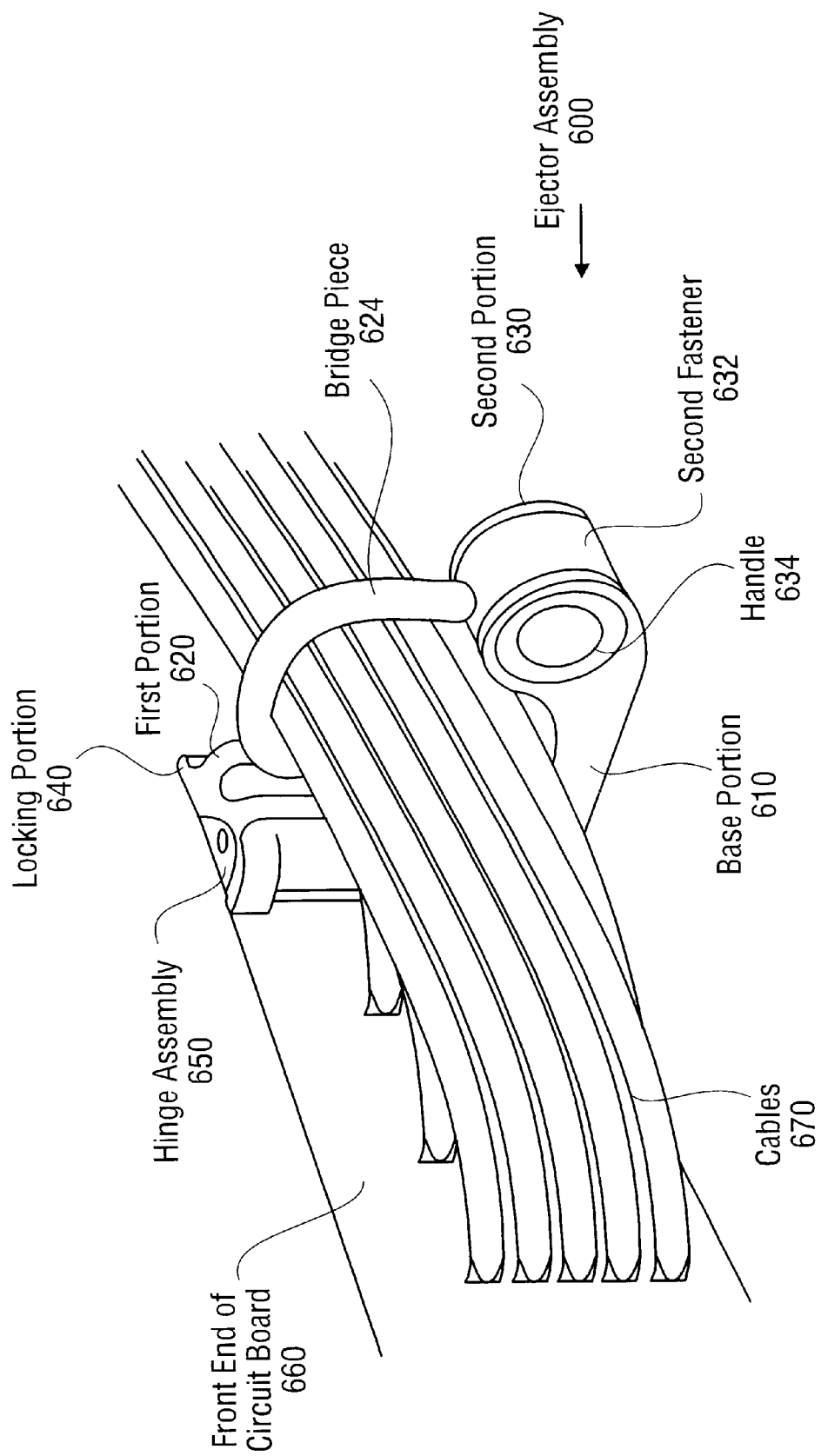
FIG. 6 illustrates a three dimensional view of an embodiment of an ejector assembly coupled to a circuit board.

FIG. 6 illustrates a three dimensional view of an embodiment of an ejector assembly to be coupled to a circuit board. In this embodiment, the ejector assembly 600 is shown to be coupled to a front end of the circuit board 660, A hinge assembly 650 on the ejector assembly 600 couples the first portion 620 to the front end of the circuit board 660. A number of cables 670 are routed toward the ejector assembly 600 and held by the ejector assembly 600 between a base portion 610 and a bridge piece 624. The bridge piece is coupled to the first portion 620 via a first fastener on one end and coupled to the second portion 630 via a second fastener 632 on the other end. The second fastener 632 is shown to be a pivot clip in the embodiment shown in FIG. 6. The second portion here includes a handle 634 that allows a user to pull a circuit board out of a chassis more easily.

Figure 7:
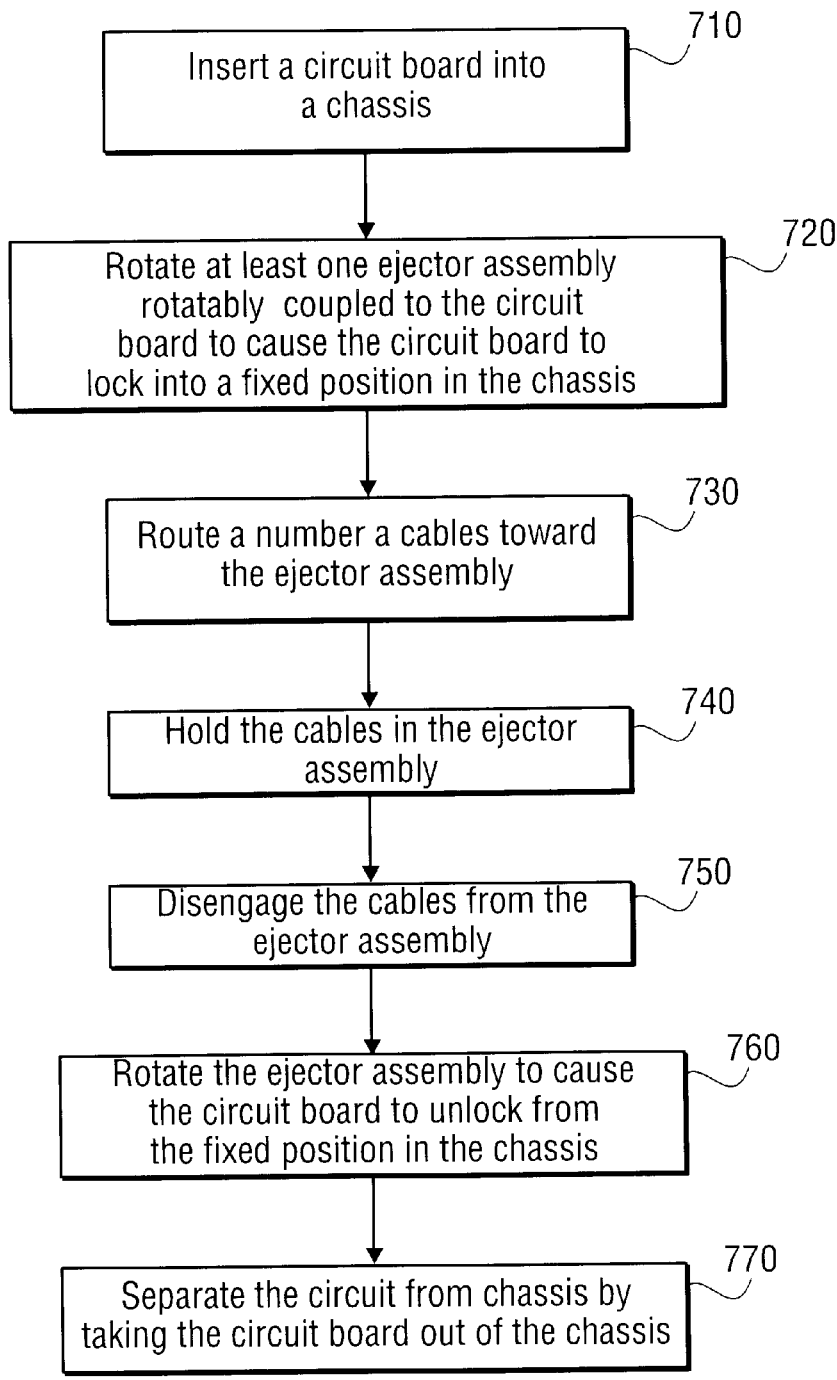
FIG. 7 illustrates a flow chart of an embodiment of a process of locking a circuit board into place in a chassis and separating the circuit board from the chassis comprising.

FIG. 7 illustrates a flow chart of an embodiment of a process 700 of locking a circuit board into place in a chassis and separating the circuit board from the chassis. In step 710, the circuit board is inserted into a chassis. In step 720, the ejector assembly rotatably coupled to the circuit board is rotated relative to the circuit board to cause the circuit board to lock into a fixed position in the chassis. After the circuit board is locked in place, cables connected to the front end of the circuit board are routed to the ejector assembly. The ejector assembly holds the cables between a base portion of the ejector assembly and a bridge piece coupled to the ejector assembly. This occurs in steps 730 and 740. In step 750, the cables are disengaged from the ejector assembly 750. In one embodiment, the bridge piece is detached from a second portion of the ejector assembly by undoing a second fastener that connects the bridge piece to the ejector assembly. In steps 760 and 770, the ejector assembly is rotated to cause the circuit board to unlock from the fixed position in the chassis, and the circuit board is separated from the chassis.

Thus, an ejector assembly is disclosed. Although the present invention is described herein with reference to specific embodiments, many modifications and variations therein will readily occur to those with ordinary skill in the art. Accordingly, all such variations and modifications are included within the intended scope of the present invention as defined by the following claims.

What is claimed is:

1. An ejector assembly detachably coupled to a circuit board to allow the circuit board to be locked into place in a chassis and separated from the chassis comprising:

a base portion rotatably coupled to the circuit board via a connector;

a locking portion disposed on the base portion, the locking portion to lock the circuit board into place when the ejector assembly is moved from a first position to a second position while the circuit board is in the chassis; and a holder coupled with the base portion, the holder to hold a number of cables.

2. The apparatus of claim 1 wherein the connector is a hinge assembly that allows the ejector assembly to be rotatably coupled with the circuit board.

3. The apparatus of claim 1 wherein the locking portion includes a protruding section that catches on a wall of the chassis to lock the circuit board into place.

4. The apparatus of claim 1 wherein the.holder comprises:

a first fastener detachably coupled to a first port, ion attached to the base portion;

a second fastener detachably coupled to a second.portion attached to the base portion; and a bridge piece that fastens to the first fastener on the first portion and the second fastener on the second portion, the bridge piece to hold the cables between the bridge piece and the base portion.

5. The apparatus of claim 4 wherein the bridge piece is an elastomeric band.

6. The apparatus of claim 5 wherein the first fastener is a knob that fastens the elastomeric band to the first portion.

7. The apparatus of claim 6 wherein the second fastener is a pivotable clip to detachably couple with the second portion.

8. The apparatus of claim 7 wherein the second portion includes a handle.

9. The apparatus of claim 1 wherein a first ejector assembly is attached to a first front end of the circuit board and a second ejector assembly is attached to a second front end of the circuit board.

10. The apparatus of claim 1 wherein the ejector assembly is made of plastic.

11. The apparatus of claim 1 wherein the ejector assembly is made of metal.

12. An ejector assembly detachably coupled to a circuit board to allow the circuit board to be locked into place in a chassis and separated from the chassis comprising:

a base portion rotatably coupled to the circuit board via a base connector, the base portion including a handle portion that extends away from the chassis;

a locking portion disposed on the base portion, the locking portion to lock the circuit board into place when the ejector assembly is moved from a first position to a second position while the circuit board is in the chassis, the locking portion including a protruding section to catch on a wall of the chassis to lock the circuit board into place; and a holder coupled with the base portion, the holder to hold a number of cables.

13. An ejector assembly detachably coupled to a circuit board to allow the circuit board to be locked into place in a chassis and separated from the chassis comprising:

a base portion rotatably coupled to the circuit board via a connecting means;

a locking means disposed on the base portion, the locking means for locking the circuit board into place when the ejector assembly is moved from a first position to a second position while the circuit board is in the chassis; and a holding means coupled with the base portion, the holding means to hold a number of cables.

14. The apparatus of claim 13 wherein the connecting means is a hinge assembly that allows the ejector assembly to be rotatably coupled with the circuit board.

15. The apparatus of claim 13 wherein the locking means is a protruding section that catches on a wall of the chassis to lock the circuit board into place.

16. The apparatus of claim 13 wherein the holding means comprises:

a first fastening means detachably coupled to a first portion attached to the base portion;

a second fastening means detachably coupled to a second portion attached to the base portion; and a bridge piece that fastens to the first fastening means and the second fastening means, the bridge piece to hold the cables between the bridge piece and the base portion.

17. The apparatus of claim 16 wherein the bridge piece is an elastomeric band.

18. The apparatus of claim 17 wherein the first fastener is a knob that fastens the elastomeric band to the first portion.

19. The apparatus of claim 18 wherein the second fastener is a pivotable clip capable of detachably coupling to the second portion.

20. The apparatus of claim 19 wherein the second portion includes a handle.

21. A method of locking a circuit board into place in a chassis comprising:

inserting the circuit board into the chassis;

rotating at least one ejector assembly rotatably coupled to the circuit board to cause the circuit board to lock into a fixed position in the chassis;

routing a number of cables toward the ejector assembly; and holding the cables in the ejector assembly.

22. A method of separating a circuit board from a chassis comprising:

disengaging a number of cables held by an ejector assembly rotatably coupled to the circuit board from the ejector assembly;

rotating the ejector assembly to cause the circuit board to unlock from a fixed position in the chassis; and separating the circuit board from the chassis by taking the circuit board out of the chassis.

23. A method of locking a circuit board into place in a chassis and separating the circuit board from the chassis comprising:

inserting the circuit board into the chassis;

rotating at least one ejector assembly rotatably coupled to the circuit board to cause the circuit board to lock into a fixed position in the chassis;

routing a number of cables toward the ejector assembly;

holding the cables in the ejector assembly;

disengaging the cables from the ejector assembly;

rotating the ejector assembly to cause the circuit board to unlock from the fixed position in the chassis; and separating the circuit board from the chassis by taking the circuit board out of the chassis.

24. An ejector comprising:

a base;

a connector coupled with the base, the connector to couple the base with a circuit board and allow relative movement between the base and circuit board;

a locking portion coupled with the base, the locking portion to secure the circuit board in a chassis; and a holder coupled with the base, the holder to detachably couple a cable with the base.

25. The ejector of claim 24, wherein the locking portion comprises a protrusion extending from the base, the protrusion to engage a surface of the chassis when the base is at a first position and to disengage the surface when the base is moved to a second position.

26. The ejector of claim 24, further comprising a handle extending from the base.

27. The ejector of claim 24, wherein the holder comprises a bridge extending about the cable and removably coupled with the base.

28. The ejector of claim 27, wherein the bridge comprises a flexible element.

29. The ejector of claim 24, wherein the connector comprises a hinge.

30. An assembly comprising:

a circuit board; and an ejector, the ejector including a base, a connector coupling the base with the circuit board and allowing relative movement between the base and circuit board, a locking portion coupled with the base, the locking portion to secure the circuit board in a chassis, and a holder coupled with the base, the holder to detachably couple a cable with the base.

31. The assembly of claim 30, wherein the locking portion comprises a protrusion extending from the base, the protrusion to engage a surface of the chassis when the base is at a first position and to disengage the surface when the base is moved to a second position.

32. The assembly of claim 30, further comprising a handle extending from the base.

33. The assembly of claim 30, wherein the holder comprises a bridge extending about the cable and removably coupled with the base.

34. The assembly of claim 33, wherein the bridge comprises a flexible element.

35. The assembly of claim 30, wherein the connector comprises a hinge.

36. The assembly of claim 30, further comprising a second ejector coupled with the circuit board.

37. An assembly comprising:

a circuit board; and an ejector disposed on the circuit board, the ejector to allow the circuit board to be locked in a chassis and separated from the chassis, the ejector including a holder to detachably couple a cable with the ejector.

38. The assembly of claim 37, wherein the holder comprises a bridge extending about the cable and removably coupled with the ejector.

39. The assembly of claim 38, wherein the bridge comprises a flexible element.

40. The assembly of claim 37, further comprising a second ejector coupled with the circuit board.

* * * * *